United States Patent
Kim et al.

(10) Patent No.: US 8,952,549 B2
(45) Date of Patent: Feb. 10, 2015

(54) SEMICONDUCTOR PACKAGES AND METHODS OF MANUFACTURING THE SAME

(75) Inventors: Doojin Kim, Chungcheongnam-do (KR); Youngsik Kim, Chungcheongnam-do (KR); Kitaik Oh, Chungcheongnam-do (KR); Sungbok Hong, Chungcheongnam-do (KR)

(73) Assignee: Samsung Electronics Co., Ltd. (KR)

( * ) Notice: Subject to any disclaimer, the term of this patent is extended or adjusted under 35 U.S.C. 154(b) by 247 days.

(21) Appl. No.: 13/614,125

(22) Filed: Sep. 13, 2012

(65) Prior Publication Data

US 2013/0200514 A1    Aug. 8, 2013

(30) Foreign Application Priority Data

Feb. 8, 2012    (KR) .................. 10-2012-0012926

(51) Int. Cl.
    *H01L 23/48*    (2006.01)
(52) U.S. Cl.
    USPC ............ 257/777; 257/E25.006; 257/E25.021; 257/E25.027; 257/E23.085; 257/E23.169
(58) Field of Classification Search
    USPC ................. 257/723, 777, E25.006, E25.021, 257/E25.027, E23.085, E23.169
    See application file for complete search history.

(56) References Cited

U.S. PATENT DOCUMENTS

| | | | | |
|---|---|---|---|---|
| 7,021,520 B2* | 4/2006 | Bowen | ........................ | 228/180.5 |
| 7,064,425 B2* | 6/2006 | Takahashi et al. | ............ | 257/686 |
| 7,115,977 B2* | 10/2006 | Komiyama et al. | ........... | 438/108 |
| 7,821,140 B2* | 10/2010 | Mii et al. | ....................... | 257/784 |
| 7,952,209 B2* | 5/2011 | Feng et al. | ..................... | 257/780 |
| 7,981,788 B2 | 7/2011 | Muto et al. | | |
| 2003/0230796 A1 | 12/2003 | Ismail et al. | | |
| 2007/0035002 A1* | 2/2007 | Moto et al. | .................... | 257/686 |
| 2009/0309642 A1 | 12/2009 | Kim | | |
| 2009/0321927 A1 | 12/2009 | Nishimura et al. | | |
| 2010/0187690 A1 | 7/2010 | Okada et al. | | |

FOREIGN PATENT DOCUMENTS

| | | |
|---|---|---|
| KR | 1020010019421 | 3/2001 |
| KR | 1020090129257 | 12/2009 |
| KR | 1020090129527 | 12/2009 |
| KR | 1020110055985 | 5/2011 |

* cited by examiner

*Primary Examiner* — Jasmine Clark
(74) *Attorney, Agent, or Firm* — Onello & Mello, LLP (57) ABSTRACT

A semiconductor package comprises a board including a board pad, a plurality of semiconductor chips mounted on the board, the semiconductor chips including chip pads. Bumps are disposed on the chip pads, respectively, and a wire is disposed between the chip pads and the bumps. The wire electrically connects the chip pads of the plurality of semiconductor chips and the board pad to each other.

15 Claims, 11 Drawing Sheets

SEMICONDUCTOR PACKAGES AND METHODS OF MANUFACTURING THE SAME

CROSS-REFERENCE TO RELATED APPLICATIONS

This U.S. non-provisional patent application claims priority under 35 U.S.C. §119 to Korean Patent Application No. 10-2012-0012926, filed on Feb. 8, 2012, the entirety of which is incorporated by reference herein.

BACKGROUND

Inventive concepts relate to semiconductor packages and methods of manufacturing the same and, more particularly, to semiconductor packages including a plurality of semiconductor chips vertically stacked, and methods of manufacturing the same.

As electronic devices become more highly integrated and include ever-increasing functionality, improved techniques for mounting a plurality of semiconductor chips within the same, common, package are required. In an approach for improving integration, a multi-stack semiconductor package can be employed. Such multi-stacked semiconductor packages include semiconductor chips that are stacked in a vertical direction on a common package board or substrate. This configuration offers many challenges, including the tight design constraints placed on bonding wires and bonding bumps employed to electrically connect the stacked semiconductor chips to the semiconductor board.

SUMMARY

Inventive concepts relate to semiconductor packages and methods of manufacturing the same.

In embodiments of inventive concepts, a semiconductor package comprises: a board including a board pad; a plurality of semiconductor chips mounted on the board, the semiconductor chips including chip pads, respectively; bumps disposed on the chip pads, respectively; and a wire disposed between the chip pads and the bumps, the wire electrically connecting the chip pads of the plurality of semiconductor chips and the board pad of the board to each other.

In some embodiments, the chip pads are disposed on edges of upper surfaces of the semiconductor chips, respectively; and an $n^{th}$ semiconductor chip positioned above a $n-1^{th}$ semiconductor chip is positioned at a side of a $n-1^{th}$ chip pad of the $n-1^{th}$ semiconductor chip for exposing the $n-1^{th}$ chip pad.

In some embodiments, the wire comprises: valley-portions corresponding to points of contact between the wire and the chip pads, respectively; and ridge-portions corresponding to portions of the wire between the points of contact, the ridge portions spaced apart from sidewalls of the semiconductor chips, respectively.

In some embodiments, the wire is disposed on the chip pad and crosses a central region of an upper surface of the chip pad; and the bump is disposed on the wire.

In some embodiments, the wire electrically connecting the chip pads and the board pad to each other is a unitary body.

In some embodiments, the wire is spaced apart from, and avoids contact with, sidewalls of the semiconductor chips.

In some embodiments, the semiconductor package further comprises: an uppermost semiconductor chip on the semiconductor chips and including a chip pad; and an uppermost bump on the chip pad of the uppermost semiconductor chip, wherein the wire is connected to a top end portion of the uppermost bump.

In some embodiments, the semiconductor package further comprises: a board bump on the board pad and electrically connected to the wire.

In embodiments of inventive concepts, a method of manufacturing a semiconductor package, comprises: providing a plurality of semiconductor chips on which chip pads are respectively formed; vertically stacking the plurality of semiconductor chips on a board including a board pad so as to expose the chip pads; providing an uppermost bump on the chip pad of an uppermost semiconductor chip of the semiconductor chips; providing a unitary wire connecting the uppermost bump to the board pad; and providing bumps on the chip pads of the stacked semiconductor chips under the uppermost semiconductor chip, respectively, the bumps adhering the wire to the chip pads, and the bumps electrically connected to the chip pads, respectively.

In some embodiments, forming the wire comprises: extending a wire from the uppermost bump to form ridge-portions and valley portions of the wire, the ridge portions of the wire corresponding to sidewalls of the semiconductor chips, the ridge portions spaced apart from the sidewalls, and the valley-portions of the wire corresponding to points of contact between wire and the chip pads of the semiconductor chips.

In some embodiments, the valley-portions of the wire are not in direct contact with the chip pads.

In some embodiments, the wire is electrically adhered to the board pad.

In some embodiments, the method further comprises: forming a board bump on a portion of the wire adhered to the board pad.

In embodiments of inventive concepts, a semiconductor package comprises: a substrate including at least one substrate pad; a plurality of semiconductor chips stacked on one another and on the substrate, each of the semiconductor chips including at least one chip pad, the semiconductor chips being positioned relative to one another so that their respective chip pads are exposed; and a wire electrically connecting at least one of the chip pads of the respective plurality of semiconductor chips with at least one of the substrate pads of the substrate, wherein the wire includes a plurality of valley portions corresponding to points of contact between the wire and the chip pads, respectively and ridge-portions corresponding to portions of the wire between the points of contact, the ridge portions spaced apart from sidewalls of the plurality of respective semiconductor chips.

In some embodiments, the wire is unitary.

In some embodiments, the semiconductor package further comprises a plurality of conductive bumps electrically connecting the wire to the at least one of the chip pads of the respective plurality of semiconductor chips.

In some embodiments, the semiconductor package further comprises a conductive bump electrically connecting the wire to the at least one of the substrate pads of the substrate.

In some embodiments, the ridge portions are positioned to avoid contact between the wire and sidewalls of the semiconductor chips.

In some embodiments, the plurality of semiconductor chips are shifted in horizontal position with respect to each other.

In some embodiments, the at least one substrate pad is positioned on an upper surface of the substrate, and wherein the at least one chip pad is positioned on an upper surface of the corresponding semiconductor chip.

BRIEF DESCRIPTION OF THE DRAWINGS

The inventive concepts will become more apparent in view of the attached drawings and accompanying detailed description.

DETAILED DESCRIPTION OF EMBODIMENTS

The inventive concepts will now be described more fully hereinafter with reference to the accompanying drawings, in which exemplary embodiments of the inventive concept are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concept. In the drawings, embodiments of the inventive concepts are not limited to the specific examples provided herein and are exaggerated for clarity.

The terminology used herein is for the purpose of describing particular embodiments only and is not intended to limit. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concepts. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Hereinafter, embodiments of the inventive concepts will be described with reference to the drawings.

Figure 1:
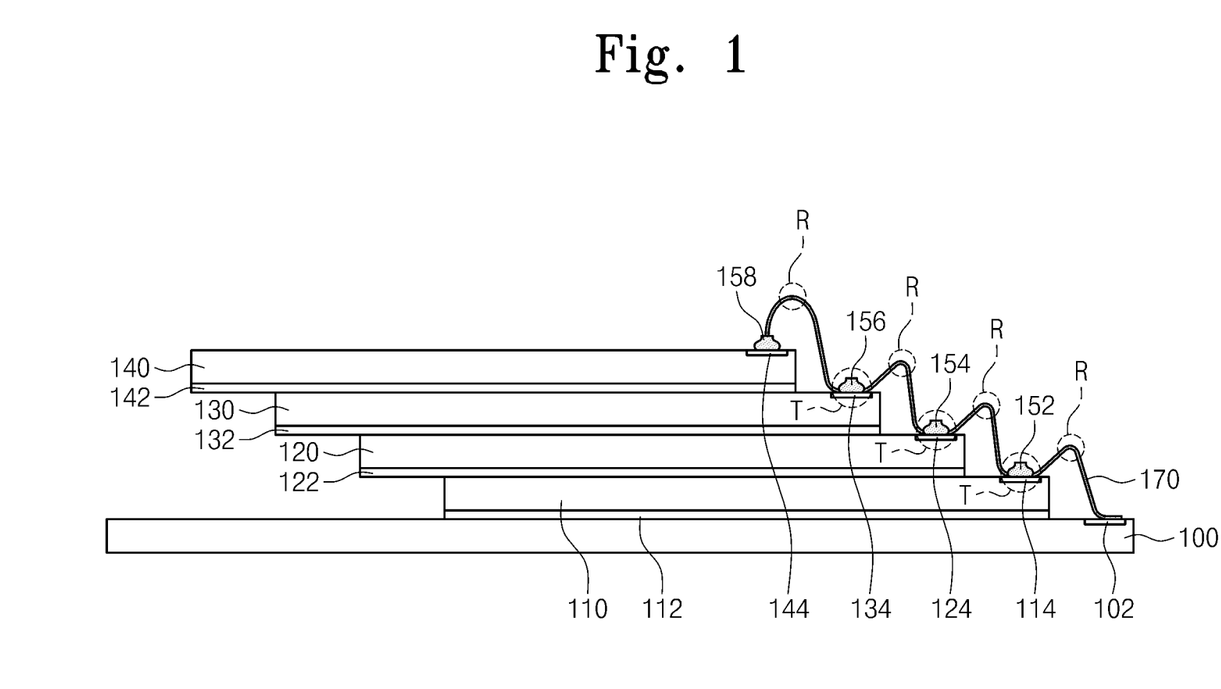
FIG. 1 is a cross sectional view illustrating a semiconductor package according to an embodiment of the inventive concepts.
Figure 2:
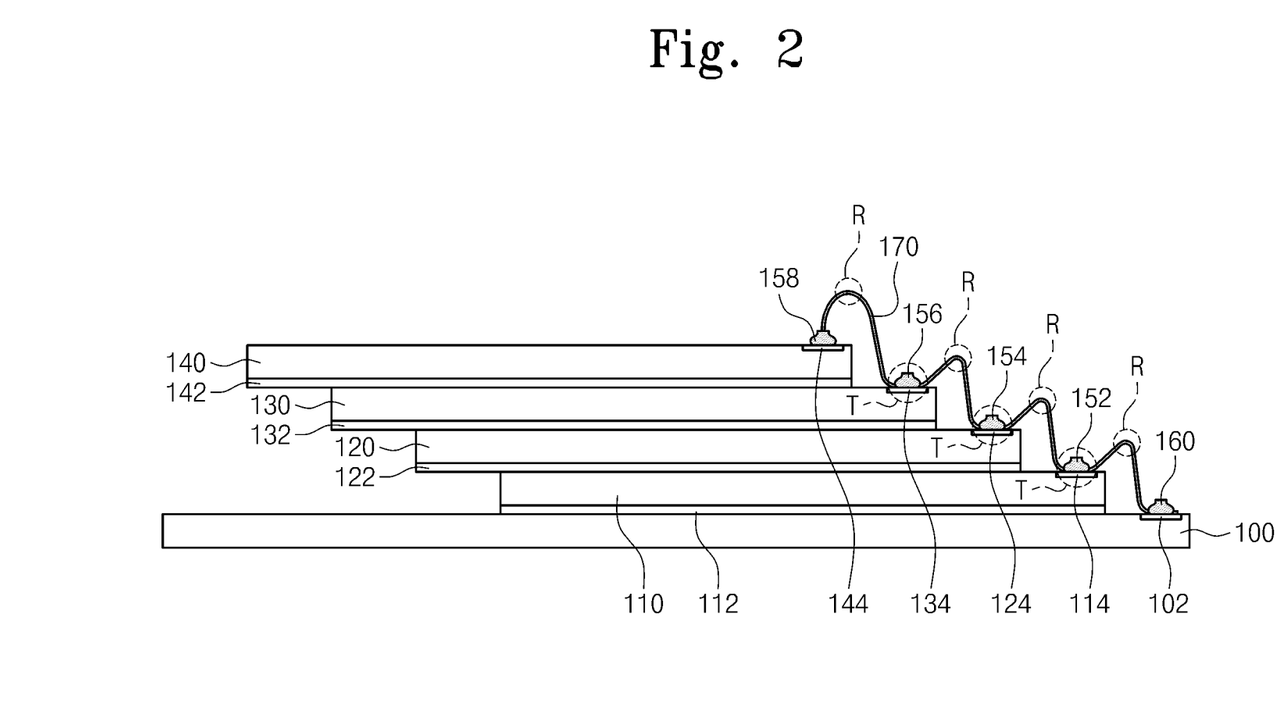
FIG. 2 is a cross sectional view illustrating a semiconductor package according to another embodiment of the inventive concepts.
Figure 3:
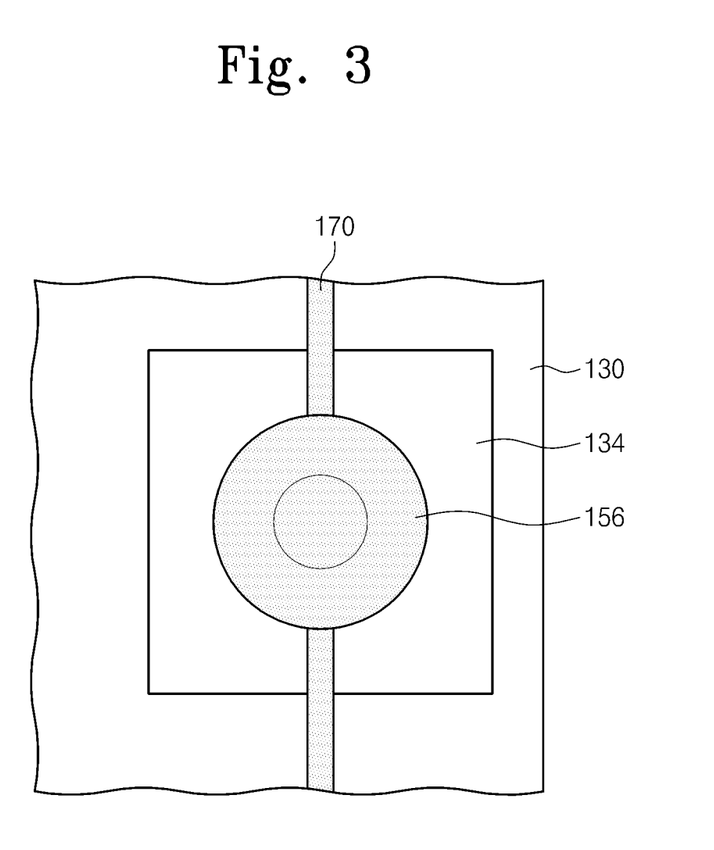
FIG. 3 is a plan view illustrating a chip pad, a wire, and a bump according to an embodiment of the inventive concepts.

FIG. 1 is a cross sectional view illustrating a semiconductor package according to an embodiment of the inventive concepts, FIG. 2 is a cross sectional view illustrating a semiconductor package according to another embodiment of the inventive concepts, and FIG. 3 is a plan view illustrating a chip pad, a wire, and a bump according to an embodiment of the inventive concepts.

Referring to FIGS. 1 and 2, a semiconductor package may include a plurality of semiconductor chips 110, 120, 130, and 140 vertically stacked on an underlying board or substrate 100. Additionally, the semiconductor package may further include one or more bonding wires 170 and one or more bumps 152, 154, 156, and 158 that operate to electrically connect the board 100 and the plurality of semiconductor chips 110, 120, 130, and 140 to each other.

In some embodiments, the board 100 may comprise a printed circuit board or other type of base or substrate suitable for supporting the vertically stacked semiconductor chips 110, 120, 130, 140. In some embodiments, one or more interconnects, or board pads 102, may be disposed on an edge or outer region of the board 100. In some embodiments, a plurality of such board pads 102 may be provided. The one or more board pads 102 may each comprise a conductive material such as lead (Pb), or other suitable conductive material.

For the purpose of ease and convenience in explanation, a stack of four semiconductor chips 110, 120, 130, and 140 will be described as an example hereinafter. A first semiconductor chip 110, a second semiconductor chip 120, a third semiconductor chip 130, and a fourth semiconductor chip 140 may be sequentially stacked on the board 100. However, the inventive concepts are not limited to the number of the semiconductor chips, and fewer than four, or more than four, such semiconductor chips may be employed in the stack.

In some embodiments, of the first to fourth semiconductor chips 110, 120, 130, and 140 may be smaller in size, for example, smaller in horizontal surface area than that of the board 100. Additionally, in some embodiments, the first to fourth semiconductor chips 110, 120, 130, and 140 may be of the same kind or type. However, embodiments of the present inventive concepts are not limited thereto, and semiconductor chips of larger horizontal surface area and chips of different kinds or types can be employed.

First to fourth chip pads 114, 124, 134, and 144 may be disposed on the first to fourth semiconductor chips 110, 120, 130, and 140, respectively. The first to fourth chip pads 114, 124, 134, and 144 may be disposed on edges of the first to fourth semiconductor chips 110, 120, 130, and 140, respectively. Each of the first to fourth chip pads 114, 124, 134, and 144 may be provided in plural. The first to fourth chip pads 114, 124, 134, and 144 may include a conductive material such as aluminum (Al).

The first semiconductor chip 110 may be disposed on the board 100 at a side of the board pad 102 in such a manner or position so as to expose the board pad 102. That is, the first semiconductor chip 110 may be stacked relative to the board pad 102 so as to be shifted toward another edge of the board 100, for exposing the board pad 102. As illustrated in the drawings, the board pad 102 may be disposed on a right edge region of the board 100 and the first semiconductor chip 110 may be shifted in position toward a left edge of the board 100 for exposing the board pad 102.

A first adhesive film 112 may be applied or positioned between the board 100 and the first semiconductor chip 110, so that the first semiconductor chip 110 may thereby be adhered to the board 100. As illustrated in the drawings, the first chip pad 114 may be disposed on a surface of the first semiconductor chip 110 that is different than a surface of the first semiconductor chip 110 on which the first adhesive film is disposed. For example, the first chip pad 114 may be disposed on a top surface of the first semiconductor chip 110 and the first adhesive film 112 may be disposed on, or otherwise interface with, a bottom surface of the first semiconductor chip 110.

The second to fourth semiconductor chips 120, 130, and 140 may similarly be disposed on the respective, underlying, first to third semiconductor chips 110, 120, and 130 for exposing the first to third chip pads 114, 124, and 134, respectively. That is, the second to fourth semiconductor chips 120, 130, and 140 may similarly be shifted in position toward another edge of the board 100. Thus, in some embodiments, the first to fourth semiconductor chips 110, 120, 130, and 140 may have a stepped structure and may be mounted on the board 100 as illustrated in the drawings.

In some embodiments, the first and second semiconductor chips 110 and 120 may similarly be adhered to each other by a second adhesive film 122 positioned therebetween, the second and third semiconductor chips 120 and 130 may be adhered to each other by a third adhesive film 132 positioned therebetween, and the third and fourth semiconductor chips 130 and 140 may be adhered to each other by a fourth adhesive film 142 positioned therebetween. In some embodiments, the first to fourth adhesive films 112, 122, 132, and 142 may comprise die attach films (DAF) generally used in contemporary package techniques; however, other suitable bonding methods may equally apply.

Referring to FIGS. 1 and 2, first to fourth interconnection bumps 152, 154, 156, and 158 may be disposed on the first to fourth chip pads 114, 124, 134, and 144, respectively. In some embodiments, the first to fourth bumps 152, 154, 156, and 158 may be formed of a material that is substantially the same material as the wire 170. For example, the first to fourth bumps 152, 154, 156, and 158 may comprise a conductive material such as gold (Au), or other suitable conductive material.

In some embodiments, the first to fourth bumps 152, 154, 156, and 158 may have horizontal cross-sectional areas that are smaller than horizontal areas of the first to fourth chip pads 114, 124, 134, and 144, respectively. For example, as illustrated in FIG. 3, the third bump 156 in contact with the third chip pad 134 may have a circular, or rounded, shape and the third chip pad 134 may have a quadrangle shape in a plan view. For example, in some embodiments, assuming the size of the third chip pad 134 to be 50 μm×50 μm, a diameter of the third bump 156 may be about 40 μm. Other suitable sizes of the chip pads and bumps are also applicable to the principles of the present inventive concepts.

Referring to FIG. 2, a board bump 160 may additionally be disposed on the board pad 102. In some embodiments, the board bump 160 may be, in similar fashion to the chip bumps 152, 154, 156, 158, smaller in horizontal cross-sectional area than the board pad 102. Additionally, the board bump 160 in contact with the board pad 102 may have a circular shape and the board pad 102 may have a quadrangle shape when viewed from the perspective of a plan view. Other suitable sizes of the board pads and bumps are also applicable to the principles of the present inventive concepts.

Referring to FIGS. 1 and 2, the wire 170 may be applied to electrically connect the first to fourth chip pads 114, 124, 134, and 144 and the board pad 102 to each other. In some embodiments, the wire 170 may include a conductive material such as gold (Au) or other suitable conductive material.

According to an embodiment illustrated in FIG. 3, the wire 170 may be aligned to cross a center of the third chip pad 134 when viewed from the perspective of a plan view. Additionally, the third bump 156 may be disposed on the center of the third chip pad 134 when viewed from the perspective of a plan view.

According to embodiments illustrated in FIGS. 1 and 2, the wire 170 may be connected to a top end portion of the fourth bump 158 corresponding to the uppermost bump. The wire 170 may extend with curvature between the third chip pad 134 and the third bump 156. The wire 170 may further extend with curvature between the second chip pad 124 and the second bump 154. The wire 170 may still further extend with curvature between the first chip pad 114 and the first bump 152. And then the wire 170 may yet further extend with curvature to an upper portion of the board pad 102. As described above, the wire 170 may thereby connect the first to fourth chip pads 113, 124, 134, and 144 and the board pad 102.

The wire 170 may include a plurality of ridge-portions R and a plurality of valley-portions T. The valley-portions T may correspond to connecting portions of the wire 170 that are disposed between the chip pads 114, 124, 134, and 144 and the bumps 152, 154, 156, and 158, respectively. The ridge-portions R may correspond to portions of the wire 170 that are adjacent to sidewalls of the semiconductor chips 110, 120, 130, and 140, respectively. The plurality of ridge-portions R may suppress or prevent contact of the wire 170 and the sidewalls of the semiconductor chips 110, 120, 130, and 140. In some embodiments, the geometries of the ridge-portions R are configured to prevent such contact. Since conductive patterns may be exposed at the sidewalls of the semiconductor chips 110, 120, 130, and 140 without the presence of intervening insulation during a cutting process used for separating the semiconductor chips 110, 120, 130, and 140 from a wafer, the sidewall of each of the semiconductor chips 110, 120, 130, and 140 can be physically separated from the wire 170, so s to avoid contact therewith.

Referring to FIG. 2, the wire 170 extending from the first chip pad 114 may extend with curvature between the board pad 102 and the board bump 160. The kind of the semiconductor may determine whether the presence of such a board bump 160 is to be desired.

[Method of Manufacturing Semiconductor Package]

FIGS. 4 to 9 are cross sectional views illustrating a method of manufacturing a semiconductor package according to an embodiment of the inventive concepts. FIGS. 6A and 6B are enlarged views of a portion A of FIG. 5.

Hereinafter, for the purpose of ease and convenience in explanation, the same elements as described above will be indicated by the same reference numerals or the same reference designators.

Figure 4:
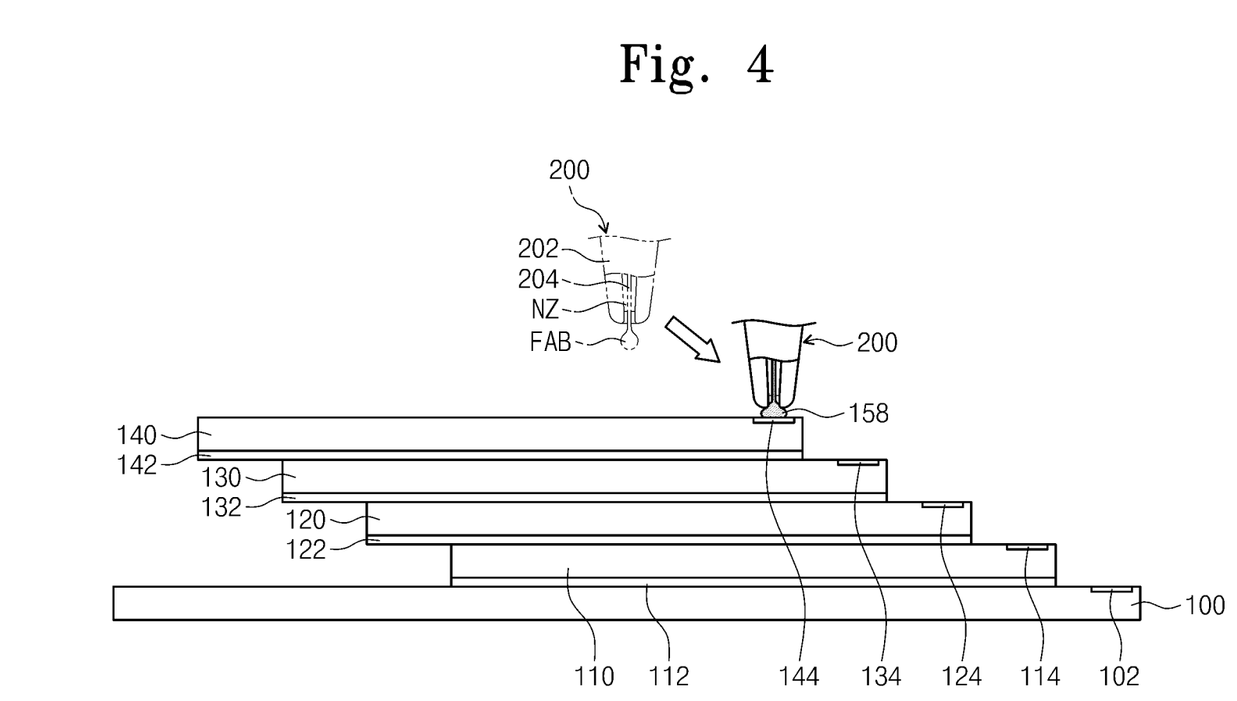
FIGS. 4 to 9 are cross sectional views illustrating a method of manufacturing a semiconductor package according to an embodiment of the inventive concepts.

Referring to FIG. 4, first to fourth semiconductor chips 110, 120, 130, and 140 respectively including first to fourth chip pads 114, 124, 134, and 144 may be vertically and sequentially stacked on a board 100 provided with a board pad 102. The first to fourth semiconductor chips 110, 120, 130, and 140 may be disposed to expose the board pad 102 and the first to third chip pads 114, 124, and 134. Additionally, the first to fourth semiconductor chips 110, 120, 130, and 140 may be fixed relative to each other, and to the board 100 by first to fourth adhesive films 112, 122, 132, and 142 therebetween. Other suitable mechanisms for adhering the chips relative to each other and to the board 100 are equally applicable to the present inventive concepts.

A fourth bump 158 may be formed on the fourth chip pad 144 corresponding to the uppermost chip pad by a capillary 200. The capillary 200 may include a body 202, a hole (not shown) penetrating the body 202, and a nozzle NZ connected to the hole. A wire 170 may be provided through the hole, and the nozzle NZ may widen at an end portion thereof.

Formation of the fourth bump 158 will now be briefly described. First, a free air ball (FAB) may be formed at the end portion of the nozzle NZ of the capillary 200. A wire 204 positioned in the capillary 200 may be exposed at the end portion of the nozzle NZ and then a high-voltage may be applied to the end portion of the capillary 200 to melt the exposed wire 204. Thus, in this manner, the free air ball FAB may be formed. The free air ball FAB may be bonded to the fourth chip pad 144, thereby forming the fourth bump 158.

Figure 5:
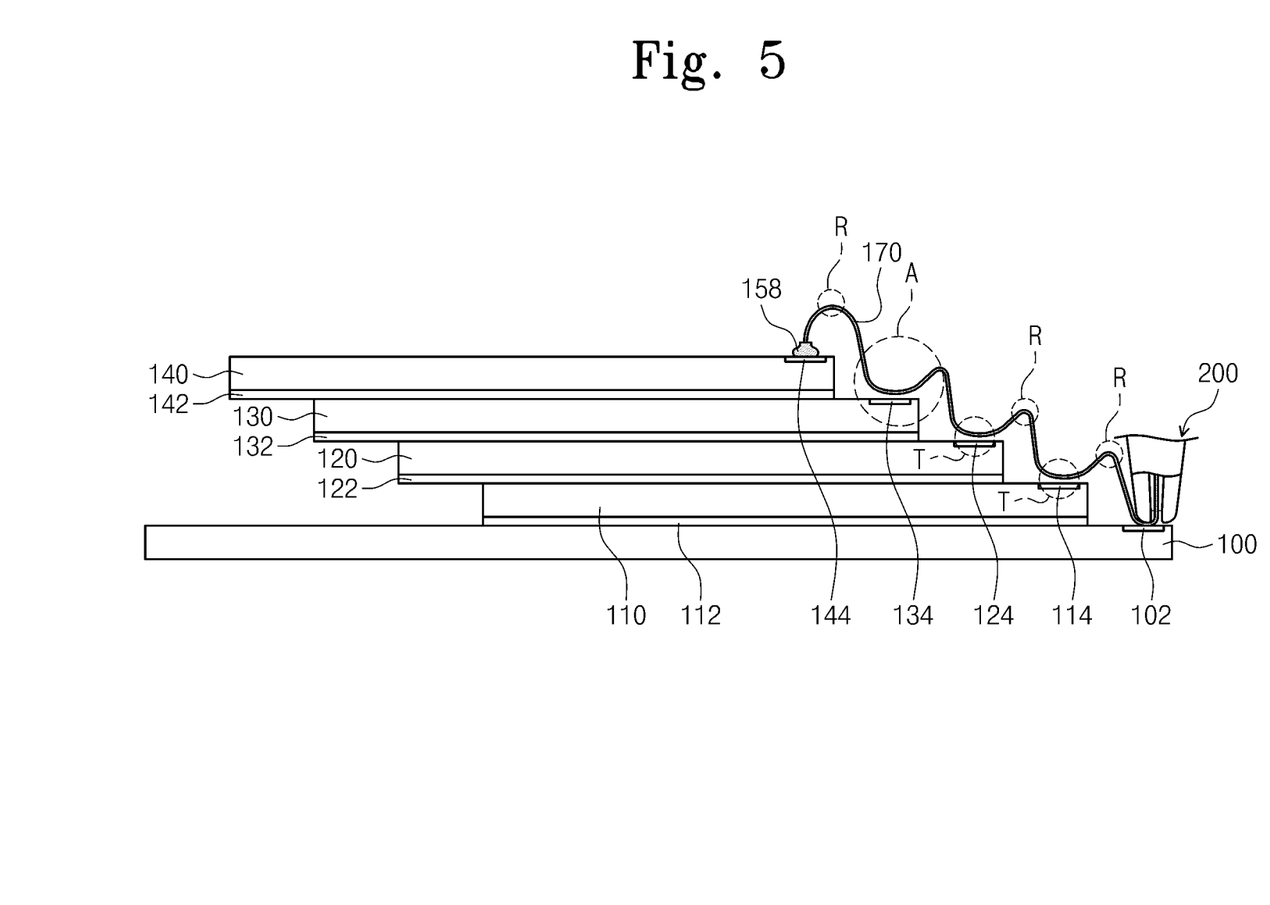
Figure 6A:
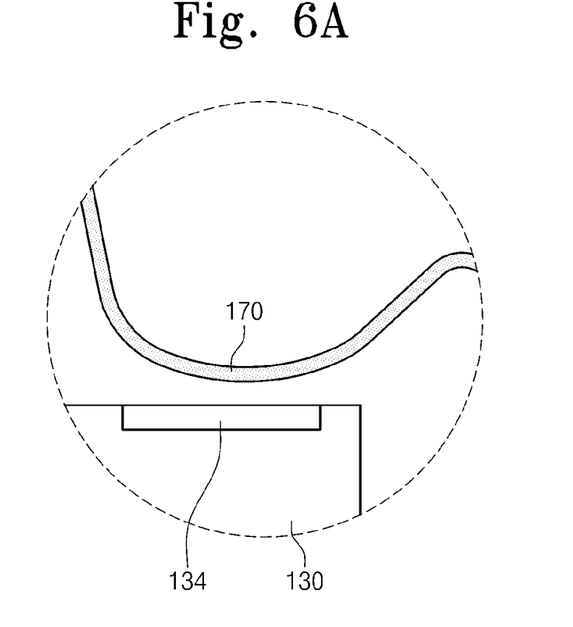
Figure 6B:
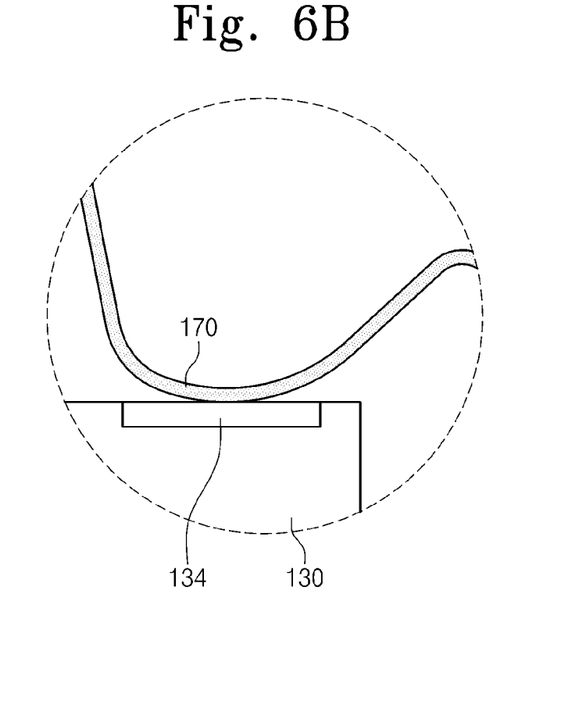
Figure 7:
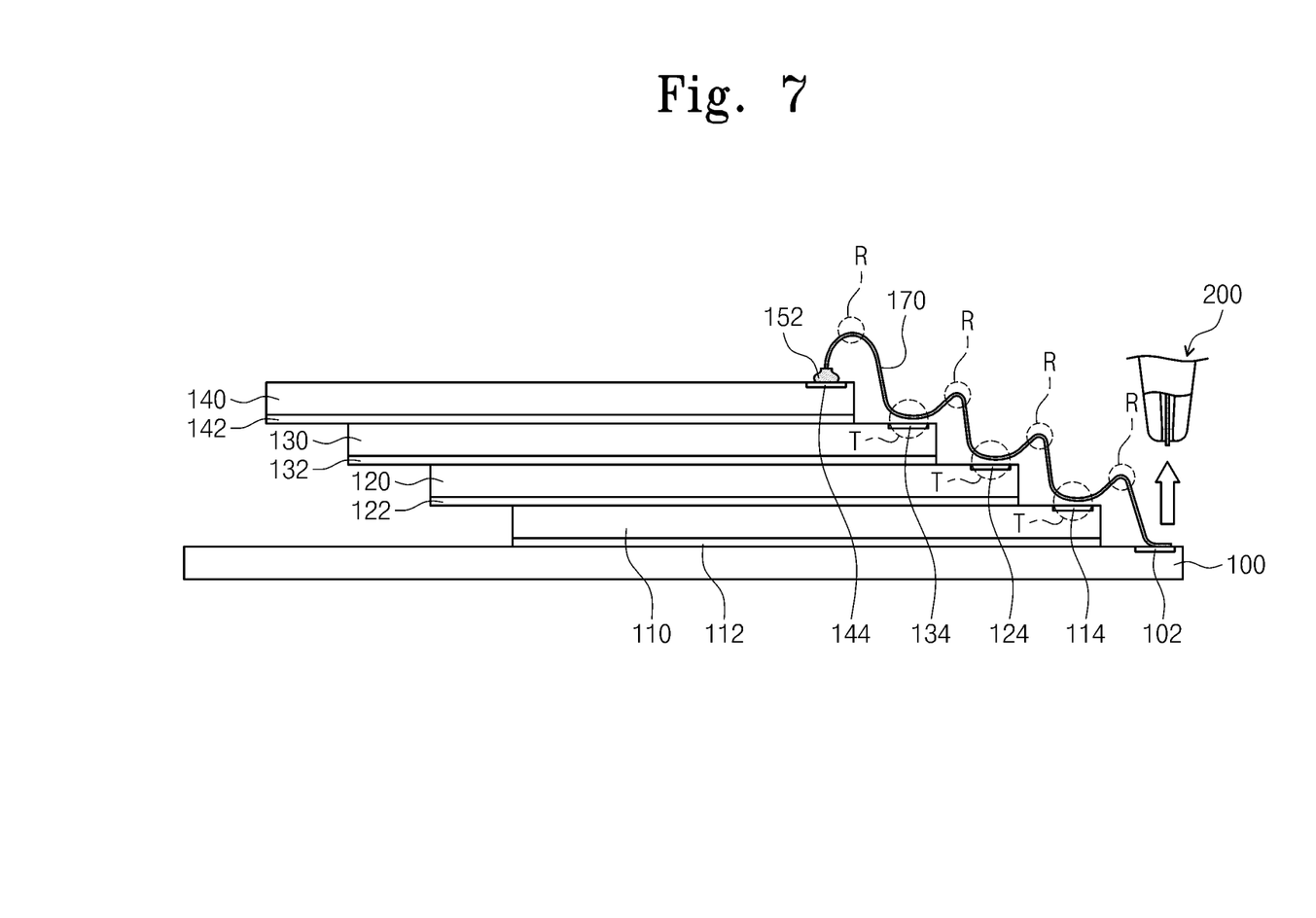

Referring to FIGS. 5 to 7, the wire 170 may be formed from the fourth bump 158 to the board pad 102 by the capillary 200.

In more detail, the capillary 200 may be moved in position from the fourth bump 148 in a vertical direction and in a horizontal direction, so that the wire 170 may be formed to include a plurality of ridge-portions R and a plurality of valley-portions T with a predetermined angle therebetween. The predetermined angle may be varied several times while the wire 170 is formed from the fourth bump 158 to the board pad 102.

Forming the wire 170 from the fourth bump 158 to the valley-portion T corresponding to the third chip pad 134 will be described as an example. The capillary 200 may be moved from the fourth bump 158 to form the ridge-portion R of the wire 170 adjacent to a sidewall of the fourth semiconductor chip 140 and to form the valley-portion T of the wire 170 adjacent to the third chip pad 134. In some embodiments, the valley-portion T of the wire 170 may be formed on a center of the third chip pad 134 when observed in a plan view.

As illustrated in FIG. 6A, in some embodiments, at this time in the fabrication process, the valley-portion T of the wire 170 does not make contact with the third chip pad 134. In this manner, it is possible to suppress damage of the third chip pad 134 that would otherwise be caused by the valley-portion T of the wire 170.

Meanwhile, as illustrated in FIG. 6B, in some embodiments, at this time in the fabrication process, the valley-portion T of the wire 170 may be in contact with the third chip pad 134. In this case, the wire 170 is not intentionally in contact with the third chip pad 134. In other words, the wire 170 may be unintentionally in contact with the third chip pad 134 as a result of gravity or as a result of errant operation of the capillary 200. As a result of such slight, unintentional, contact, damage to the third chip pad 134 by an intentional pressure of the wire 170 or by intentional application of an is thus avoided.

Similarly to the process forming the valley-portion T of the wire 170 of the third chip pad 134 from the fourth bump 158, the wire 170 may be made to extend to be connected from the fourth bump 158 to the board 102 via the third, second, and first chip pads 134, 124, and 114. Referring to FIG. 7, the wire in the capillary 200 may be cut from the wire 170 contacting the board pad 102 using certain cutting mechanisms present in the capillary 200.

According to some embodiments of the inventive concepts, an apparatus capable of changing the angle of the wire 170 may be utilized for forming the wire 170 that connects the uppermost semiconductor chip 140 of the semiconductor chips 110, 120, 130, and 140 and for causing the wire to have the plurality of ridge-portions R and the plurality of valley-portions T. For example, the apparatus may comprise ICONN apparatus of Kulicke & Soffa Pte Ltd of the USA and/or UTC-3000 apparatus of Sinkawa Co. of Japan. The wire 170 may be formed in the ICONN apparatus by applying PS advanced loop mode. The wire 170 may be formed in the UTC-3000 apparatus by applying ICP multi loop mode. These apparatus are described as example apparatus that may be utilized by the systems and methods of the present inventive concepts. However, the inventive concepts are not limited to use of the above apparatus.

Figure 8:
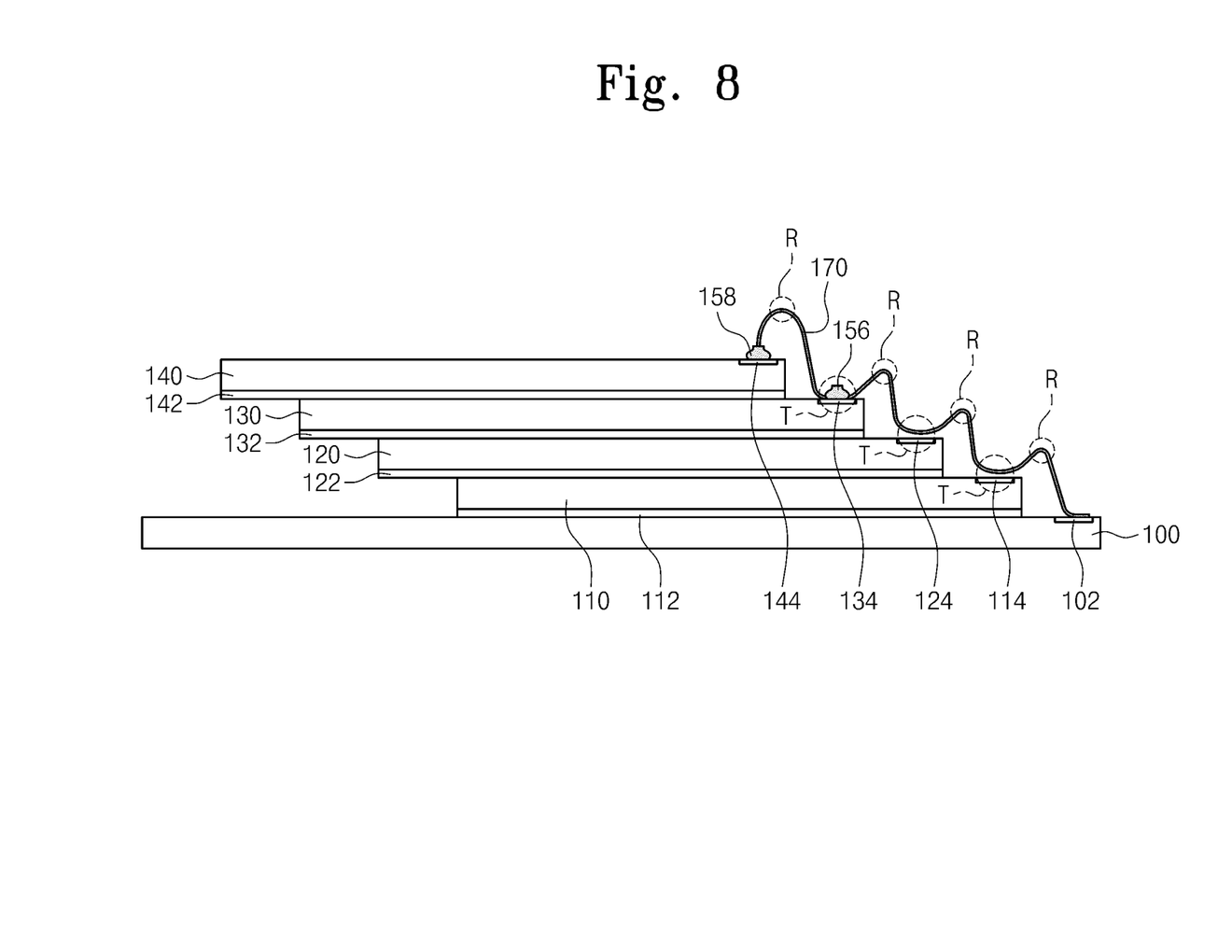

Referring to FIG. 8, the third bump 156 may be formed on the valley-portion T of the portion of the wire 170 adjacent to the third chip pad 134 by the capillary 200. Further, the portion of the wire 170 that is spaced apart from the third chip pad 134, as shown in FIG. 6A, may also be adhered to the third chip pad 134 during the formation of the third bump 156. As illustrated in FIG. 6B, the example of the wire 170, which is not in electrical contact with, but in physical contact with, the third chip pad 134, may also be adhered to the third chip pad 134 during the formation of the third bump 156. Thus, the third bump 156 may be electrically connected to the third chip pad 134 by the wire 170.

Figure 9:
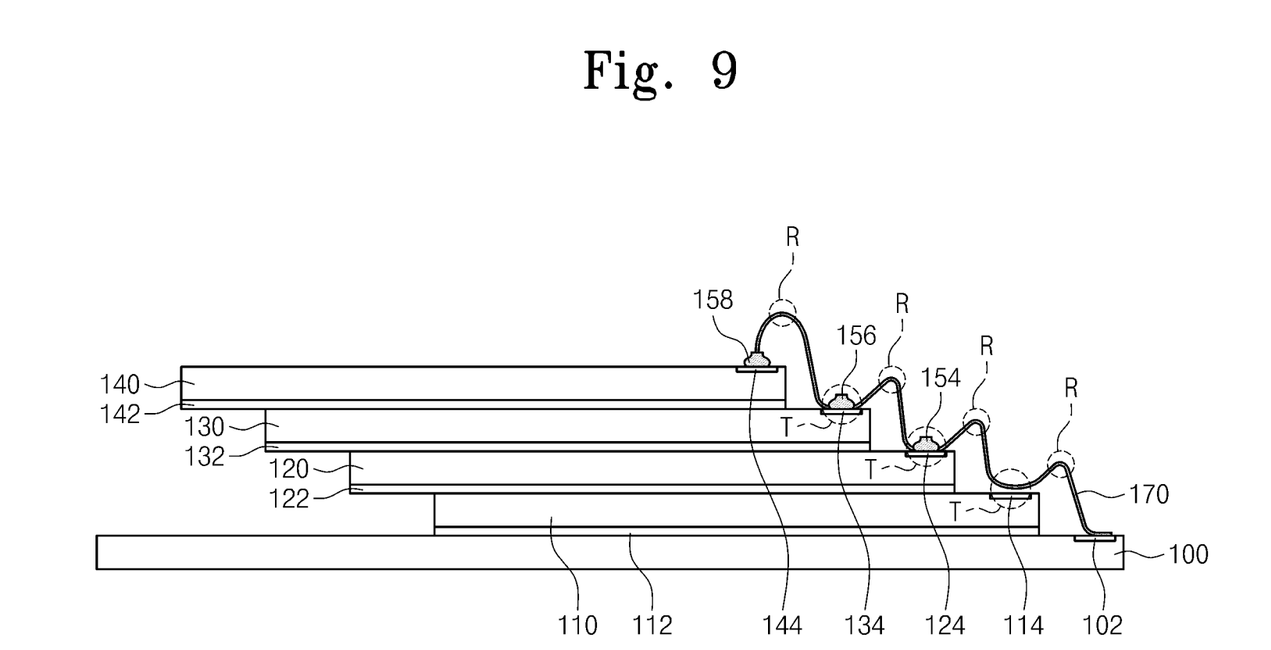

Referring to FIG. 9, the second bump 154 may be formed on the valley-portion T of the portion of the wire 170 that is positioned adjacent the second chip pad 124. In a manner similar to the description herein with reference to FIG. 8, the second bump 154 may optionally be electrically connected to the second chip pad 124 by the wire 170.

Referring to FIG. 1 again, the first bump 152 may be formed on the valley-portion T of the wire that is positioned adjacent the first chip pad 114. This description may be the same as described with reference to FIG. 8.

Referring to FIG. 2, the board bump 160 may be formed on the portion of the wire 170 in the region of the board pad 102.

In this case, the wire 170 may be adhered to the board pad 102 and the board bump 160 may be formed on the adhered wire 170.

Figure 10A:
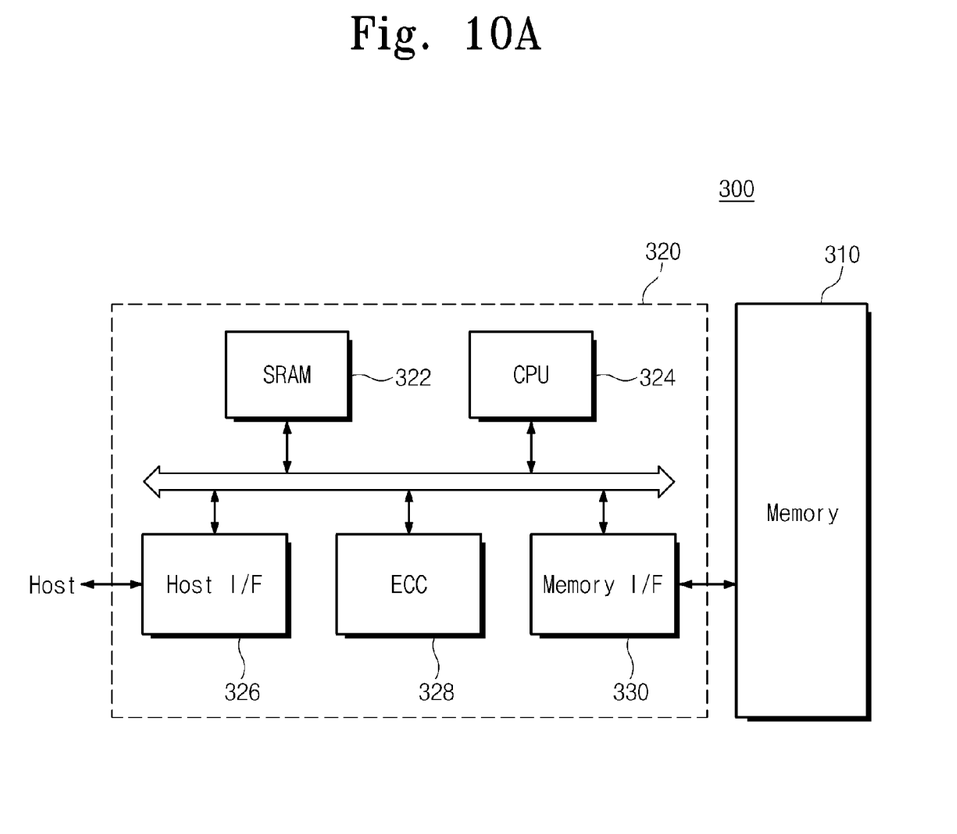
FIG. 10A is a schematic block diagram illustrating an example of memory cards provided with semiconductor packages according to embodiments of the inventive concepts.

As described herein with reference to FIGS. 8, 9, and 10, in some embodiments, the bumps 152, 154, 156, and 158 and the wire 170 may be adhered to the chip pads 114, 124, 134, and 144 sequentially, or otherwise one at a time. In this manner, any damage to the chip pads 114, 124, 134, and 144 may be mitigated or prevented. As a result, it is possible to suppress problems that would otherwise be caused by any reduction in thickness of the semiconductor chips 110, 120, 130, and 140.

FIG. 10A is a schematic block diagram illustrating an example of memory cards provided with semiconductor packages according to embodiments of the inventive concept.

Referring to FIG. 10A, the semiconductor package according to embodiments of the inventive concepts may be applied to a memory card 300. For example, the memory card 300 may include a memory controller 320 that controls data communication between a host and a memory device 310. A SRAM device 322 may be used as an operation memory of a central processing unit (CPU) 324. A host interface unit 326 may be configured to include a data communication protocol between the memory card 300 and the host. An error check and correction (ECC) block 328 may detect and correct errors of data which are read out from the memory device 310. A memory interface unit 330 may interface the memory device 310. The CPU 324 controls overall operations of the memory controller 324.

When the memory device 310 applied to the memory card 300 includes the semiconductor package according to embodiments of the inventive concept, it is possible to suppress the damage of the semiconductor chips, and reliability of the resulting memory card is thus improved.

Figure 10B:
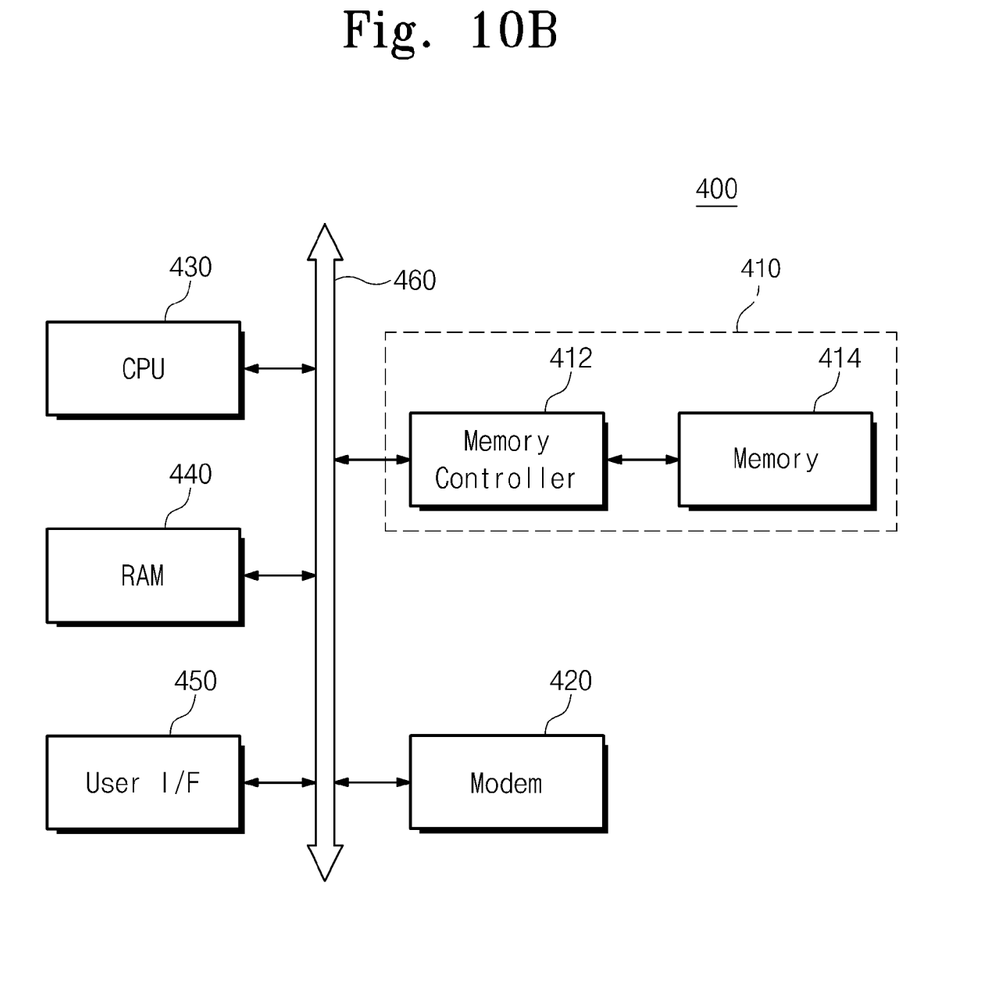
FIG. 10B is a schematic block diagram illustrating an example of information process systems provided with semiconductor packages according to embodiments of the inventive concepts.

FIG. 10A is a schematic block diagram illustrating an example of information process systems provided with semiconductor packages according to embodiments of the inventive concept.

Referring to FIG. 10A, an information processing system 400 may include the semiconductor package according to embodiments of the inventive concept. The information processing system 400 may include, in some embodiments, a mobile device or a computer. For example, the information processing system 400 may include a modem 420, a central processing unit (CPU) 430, a random access memory (RAM) 440, and a user interface unit 450 that are electrically connected to a memory system 410 through a system bus 460. The memory system 410 may store data processed by the central processing unit 1330 or data inputted from an external device. The memory system 410 may include a memory device 412 and a memory controller 414. The memory system 410 may be substantially the same as the memory card 300 described with reference to FIG. 10A. The information processing system 400 may be realized as a memory card, a solid state disk (SSD) device, a camera image sensor and another type of application chipset. For example, the memory system 410 may consist of the SSD device. In this case, the information processing system 400 may stably and reliably store very large quantities of data.

According to embodiments of the inventive concept, after the wire is formed to be adjacent to the chip pads and to be spaced apart from the semiconductor and is formed from the uppermost chip pad to the board, the wire may be adhered to the chip pads during the formation of the bumps. Thus, it is possible to reduce the amount of physical pressure and energy applied to the chip pads. As a result, even though the relative thicknesses of the semiconductor chips is made to decrease, it is possible to minimize or prevent damage to the chip pads and reliability of the resulting devices can thereby be increased.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A semiconductor package comprising:
   a board including a board pad;
   a plurality of semiconductor chips mounted on the board, the semiconductor chips including chip pads, respectively;
   bumps disposed on the chip pads, respectively; and
   a wire disposed between the chip pads and the bumps, the wire electrically connecting the chip pads of the plurality of semiconductor chips and the board pad of the board to each other.

2. The semiconductor package of claim 1, wherein the chip pads are on edges of upper surfaces of the semiconductor chips, respectively; and
   wherein an $n^{th}$ semiconductor chip positioned above a $n-1^{th}$ semiconductor chip is positioned at a side of a $n-1^{th}$ chip pad of the $n-1^{th}$ semiconductor chip for exposing the $n-1^{th}$ chip pad.

3. The semiconductor package of claim 1, wherein the wire comprises:
   valley-portions corresponding to points of contact between the wire and the chip pads, respectively; and
   ridge-portions corresponding to portions of the wire between the points of contact, the ridge portions spaced apart from sidewalls of the semiconductor chips, respectively.

4. The semiconductor package of claim 1, wherein the wire is on the chip pad and crosses a central region of an upper surface of the chip pad; and
   wherein the bump is disposed on the wire.

5. The semiconductor package of claim 1, wherein the wire electrically connecting the chip pads and the board pad to each other is a unitary body.

6. The semiconductor package of claim 1, wherein the wire is spaced apart from, and avoids contact with, sidewalls of the semiconductor chips.

7. The semiconductor package of claim 1, further comprising:
   an uppermost semiconductor chip on the semiconductor chips and including a chip pad; and
   an uppermost bump on the chip pad of the uppermost semiconductor chip, wherein the wire is connected to a top end portion of the uppermost bump.

8. The semiconductor package of claim 7, further comprising:
   a board bump on the board pad and electrically connected to the wire.

9. A semiconductor package comprising:
   a substrate including at least one substrate pad;
   a plurality of semiconductor chips stacked on one another and on the substrate, each of the semiconductor chips including at least one chip pad, the semiconductor chips being positioned relative to one another so that their respective chip pads are exposed; and a wire electrically connecting at least one of the chip pads of the respective plurality of semiconductor chips with at least one of the substrate pads of the substrate, wherein the wire includes a plurality of valley portions corresponding to points of contact between the wire and the chip pads, respectively and ridge-portions corresponding to portions of the wire between the points of contact, the ridge portions spaced apart from sidewalls of the plurality of respective semiconductor chips.

10. The semiconductor package of claim 9 wherein the wire is unitary.

11. The semiconductor package of claim 9 further comprising a plurality of conductive bumps electrically connecting the wire to the at least one of the chip pads of the respective plurality of semiconductor chips.

12. The semiconductor package of claim 9 further comprising a conductive bump electrically connecting the wire to the at least one of the substrate pads of the substrate.

13. The semiconductor package of claim 9 wherein the ridge portions are positioned to avoid contact between the wire and sidewalls of the semiconductor chips.

14. The semiconductor package of claim 9 wherein the plurality of semiconductor chips are shifted in horizontal position with respect to each other.

15. The semiconductor package of claim 9 wherein the at least one substrate pad is positioned on an upper surface of the substrate, and wherein the at least one chip pad is positioned on an upper surface of the corresponding semiconductor chip.

* * * * *